(12) United States Patent
Robinson et al.

(10) Patent No.: US 9,159,943 B2
(45) Date of Patent: Oct. 13, 2015

(54) LIGHT-EMITTING ELECTROCHEMICAL DEVICE, A SYSTEM COMPRISING SUCH A DEVICE AND USE OF SUCH A DEVICE

(75) Inventors: Nathaniel D. Robinson, Kolmaarden (SE); Ludvig Edman, Umeaa (SE); Piotr Matyba, Umeaa (SE)

(73) Assignee: LUNALEC AB, Umea (SE)

( * ) Notice: Subject to any disclaimer, the term of this patent is extended or adjusted under 35 U.S.C. 154(b) by 651 days.

(21) Appl. No.: 13/504,400

(22) PCT Filed: Oct. 28, 2010

(86) PCT No.: PCT/SE2010/051169
§ 371 (c)(1),
(2), (4) Date: Apr. 26, 2012

(87) PCT Pub. No.: WO2011/053236
PCT Pub. Date: May 5, 2011

(65) Prior Publication Data
US 2012/0228597 A1    Sep. 13, 2012

(30) Foreign Application Priority Data
Oct. 28, 2009   (SE) ...................... 0950800

(51) Int. Cl.
*H01L 51/50*   (2006.01)
*B82Y 30/00*   (2011.01)
*B82Y 40/00*   (2011.01)
*B82Y 10/00*   (2011.01)
*H01L 51/52*   (2006.01)
*H01L 51/00*   (2006.01)

(52) U.S. Cl.
CPC ............. *H01L 51/5032* (2013.01); *B82Y 10/00* (2013.01); *B82Y 30/00* (2013.01); *B82Y 40/00* (2013.01); *H01L 51/0045* (2013.01); *H01L 51/5024* (2013.01); *H01L 51/5234* (2013.01); *H01L 51/0036* (2013.01); *H01L 51/0038* (2013.01); *H01L 51/0039* (2013.01); *H01L 51/0054* (2013.01); *H01L 51/0072* (2013.01); *H01L 51/0086* (2013.01); *H01L 51/5206* (2013.01); *H01L 2251/5323* (2013.01); *H01L 2251/5338* (2013.01)

(58) Field of Classification Search
None
See application file for complete search history.

(56) References Cited

U.S. PATENT DOCUMENTS

| 5,677,546 A | 10/1997 | Yu |
| 5,682,043 A | 10/1997 | Pei et al. |

(Continued)

FOREIGN PATENT DOCUMENTS

| JP | 60165772 A | 8/1985 |
| JP | 10506747 | 6/1998 |

(Continued)

OTHER PUBLICATIONS

Peumans et al., Organic Light-Emitting Diodes on Solution-Processed Graphene Transparent Electrodes, 2010, ACS NANO, vol. 4, No. 1, p. 43-48.*

(Continued)

*Primary Examiner* — Gregory Clark
(74) *Attorney, Agent, or Firm* — Hulquist, PLLC; Steven J. Hulquist (57) ABSTRACT

A light-emitting device is provided having an anode, a cathode, and a light-emitting material contacting and separating the cathode and anode. Wherein the cathode includes a graphene and/or graphene oxide.

19 Claims, 5 Drawing Sheets

(56) References Cited

U.S. PATENT DOCUMENTS

| | | | |
|---|---|---|---|
| 5,900,327 | A | 5/1999 | Pei et al. |
| 6,908,696 | B2 | 6/2005 | Imamura et al. |
| 7,015,639 | B2 | 3/2006 | Stegamat et al. |
| 7,413,916 | B2 | 8/2008 | Seo et al. |
| 7,719,180 | B2 | 5/2010 | Spindler et al. |
| 8,233,211 | B2 | 7/2012 | Kondou et al. |
| 2007/0236138 | A1 | 10/2007 | Hu et al. |
| 2007/0284557 | A1 | 12/2007 | Gruner et al. |
| 2008/0084158 | A1 | 4/2008 | Shao et al. |
| 2009/0017211 | A1* | 1/2009 | Gruner et al. ............ 427/258 |
| 2009/0146111 | A1 | 6/2009 | Shin et al. |
| 2010/0187482 | A1 | 7/2010 | Mullen et al. |

FOREIGN PATENT DOCUMENTS

| | | | |
|---|---|---|---|
| JP | 2002324401 | | 11/2002 |
| JP | 2003092185 | | 3/2003 |
| JP | 2003272841 | | 9/2003 |
| JP | 2004146379 | | 5/2004 |
| JP | 2005302332 | | 10/2005 |
| JP | 2007294261 | | 11/2007 |
| JP | 2007321163 | | 12/2007 |
| JP | 2009037810 | | 2/2009 |
| JP | 2010532300 | | 10/2010 |
| JP | 2011501432 | | 1/2011 |
| WO | 9600983 | | 1/1996 |
| WO | 2007004113 | | 1/2007 |
| WO | 2007114645 | A1 | 10/2007 |
| WO | 2007127870 | A2 | 11/2007 |
| WO | WO 2007/127870 | * | 11/2007 ............ H01L 51/00 |
| WO | 2008046010 | A2 | 4/2008 |
| WO | 2008128726 | | 10/2008 |
| WO | 2009036071 | A2 | 3/2009 |
| WO | 2009038033 | | 3/2009 |
| WO | 2009051684 | | 4/2009 |
| WO | 2009123771 | | 10/2009 |
| WO | 2010085180 | | 7/2010 |

OTHER PUBLICATIONS

Qin et al., Multilayered graphene used as anode of organic light emitting devices, 2010, Applied Physics Letters, vol. 96, pp. 13301-1-133301-3.*

Japanese Office Action for JP 2012-536758, Dated Dec. 25, 2014, 6 Pages.

Extended European Search Report for EP 10827243.6, Dated Feb. 15, 2013, 10 Pages.

Wang et al. Applied Physics Letters 2009, vol. 95, 3 Pages, "Large area, continuous, few-layered graphene as anodes in organic photovoltaic devices."

Ueno et al. Monthly Display Aug. 1, 2009, vol. 15, No. 8, English Translation attached to original, All together 13 Pages, "Technology for Solubilizing Graphene and Application thereof Transparent Conductive Film."

English Translation of Japanese Office Action for Japanese Application No. 2012-536758, Dated Jan. 21, 2014, 5 Pages.

Slinker et al. "Direct measurement of the electric-field distribution in a light-emitting electrochemical cell", Nature Materials Nov. 2007, vol. 6, p. 894-899.

Slinker et al. "Efficient Yellow Electroluminescence from a Single Layer of a Cyclometalated Iridium Complex", J. Am. Chem. Soc. 2004, vol. 126, p. 2763-2767.

Shin et al. "The influence of electrodes on the performance of light-emitting electrochemical cells", Electrochimica Acta 2007, vol. 52, p. 6456-6462.

Reina et al. "Transferring and Identification of Single- and Few-Layer Graphene on Arbitrary Substrates", The Journal of Physical Chemistry C Letters 2008, vol. 112, p. 17741-17744.

Lowry et al. "Single-Layer Electroluminescent Devices and Photoinduced Hydrogen Production from an Ionic Iridium (III) Complex", Chem. Mater. 2005, vol. 17, p. 5712-5719.

Liang et al. "Graphene Transistors Fabricated via Transfer-Printing in Device Active-Areas on Large Wafer", Nano Letters 2007, vol. 7, No. 12, p. 3840-3844.

Eda et al. "Large-area ultrathin films of reduced graphene oxide as a transparent and flexible electronic material", Nature Nanotechnology May 2008, vol. 3, p. 270-274.

Slinker et al. "Temperature dependence of tris(2,2'-bipyridine) ruthenium (II) device characteristics", Journal of Applied Physics Apr. 15, 2004, vol. 95, No. 8, p. 4381-4384.

Yanshao et al. "Long-lifetime Polymer Light-Emitting Electrochemical Cells", Adv. Mater. 2007, vol. 19, p. 365-370.

Cao et al. "Efficient, fast response light-emitting electrochemical cells: Electroluminescent and solid electrolyte polymers with interpenetrating network morphology", Appl. Phys. Lett. Jun. 1996, vol. 63, No. 23, p. 3218-3220.

Shin et al. "Light emission at 5 V from a polymer device with a millimeter-sized interelectrode gap", Applied Physics Letters 2006, vol. 89, p. 013509-1-013509-3.

Fang et al. "The Design and Realization of Flexible, Long-Lived Light-Emitting Electrochemical Cells", Adv. Funct. Mater. 2009, vol. 19, p. 2671-2676.

Hirata et al. "Thin-film particles of graphite oxide 1: High-yield synthesis and flexibility of the particles", Carbon 2004, vol. 42, p. 2929-2937.

International Search Report and Written Opinion for PCT/SE2010/051169, Both completed by the Swedish Patent Office on Jan. 31, 2011, All together 10 Pages.

* cited by examiner

LIGHT-EMITTING ELECTROCHEMICAL DEVICE, A SYSTEM COMPRISING SUCH A DEVICE AND USE OF SUCH A DEVICE

CROSS-REFERENCE TO RELATED APPLICATION

This application is the U.S. national phase of PCT Appln. No. PCT/SE2010/051169 filed on Oct. 28, 2010, which claims priority to SE Patent Application No. 0950800-3 filed on Oct. 28, 2009, the disclosures of which are incorporated in their entirety by reference herein.

TECHNICAL FIELD

The present disclosure relates to a light-emitting device, and more particularly to an organic light-emitting device, such as a light-emitting electrochemical cell (LEC) or an organic light-emitting diode (OLED). The disclosure further relates to a system comprising such a device, to the use of graphene and/or graphene oxide in an LEC or an OLED and to the use of the device for generating light.

BACKGROUND

Technologies like printed electronics are opening the possibility for light-emitting devices that are light-weight, flexible, low-cost, and relatively efficient compared to, e.g. incandescent light bulbs, and that can be created on large surfaces. Organic light-emitting devices such as the polymer organic light-emitting diode (p-OLED) are slated to revolutionize the use of electronics, bringing it to currently inactive surfaces in applications such as architecture (walls, ceilings, etc.), and consumer packaging (for advertising, information display, etc.). p-OLEDs have the advantage over so-called small molecule OLEDs (sm-OLEDs) in that the polymer active material can usually be manufactured via printing and simple coating techniques, while the small molecule active material in sm-OLEDs require more expensive vacuum processing to manufacture.

OLEDs require two electrodes made of conducting materials to function. In p-OLEDs, the alignment of the work function of the cathode (the negative electrode) with the lowest unoccupied molecular orbital (LUMO) of the light-emitting and semiconducting polymer in the active material, and the alignment of the work function of the anode (the positive electrode) with the highest occupied molecular orbital (HOMO) of the polymer, are critical for the attainment of efficient and balanced charge injection and efficient device operation. Materials that are suitable for the cathode in p-OLEDs in accordance with the above criteria are metals with low work functions (e.g. Ca), and which therefore are highly reactive. Moreover, such low-work function metals are not amenable to solution processing. The necessity for a low-work function metal as one of the electrode materials in p-OLEDs accordingly represents a serious problem from both a stability and fabrication perspective.

Furthermore, at least one of the two electrodes in OLED devices must be transparent; otherwise, the light generated within the active material will never emerge from the device. In OLEDs a transparent and conducting material termed indium tin-oxide (ITO) is commonly used as the anode, but as a material, ITO is not ideal. The surface of ITO is typically very uneven and problems stemming from the formation of hot spots and electrical short circuits during operation of OLEDs are well known in the field. Moreover, the amount of Indium in the world is limited, so the material is becoming increasingly expensive. Finally, devices comprising metals in general, including indium and tin, may be difficult to re-cycle and often require special handling during waste disposal, etc.

To summarize the situation with OLED devices, the current generation is not amenable to solution processing of all components (i.e. the cathode, active material and anode). The active material in sm-OLEDs is typically not amenable to solution processing, and functional p-OLEDs comprise a cathode, which is reactive and not suitable for solution processing. Moreover, typical employed metal-based electrode materials in OLED devices are often expensive, heavy, non-disposable, and in some cases even hazardous In the latter context, we note that US20090017211A1 discloses how graphene/graphene oxide can be used to replace ITO as the anode material in an OLED, but that no actual functional device is demonstrated.

One way to overcome the drawbacks of OLEDs is to add an electrolyte to the active material to create a device called a light-emitting electrochemical cell, or a LEC. The unique operation of LEC devices is based on mobile ions that are intimately intermixed with the light-emitting (polymer or small molecule) organic semiconductor. These ions redistribute during device operation in order to allow for efficient and balanced electronic charge injection, which in turn eliminates the work function requirements on the electrodes.

Another advantage of LEC devices is that the thickness of the active layer (the inter-electrode gap), in some cases is not critical for the device to operate optimally, as it is in an OLED. This is because the mobile ions in the active material enable electrochemical doping of the organic semiconductor. One example of the thickness independence in LEC devices is described in U.S. Pat. No. 5,677,546, wherein a planar surface cell configuration with a large micrometer-sized inter-electrode gap is disclosed. Moreover, Shin et al. (Applied Physics Letters, 89, 013509, 2006) have demonstrated that planar surface cell devices with an enormous mm-sized inter-electrode gap separating identical (high-work function and stabile) Au electrodes can be operated with efficient emission at a low applied voltage of 5 V.

LECs, however, have other challenges. For example, the mobile ions in LECs enable side-reactions, both electrochemical and chemical. This limits the choice of materials useable in the device, especially for the electrodes. For example, an article describing electrochemical side-reactions associated with using aluminum instead of gold electrodes in LECs were highlighted by Shin et al. (Electrochimica Acta, 52, pp. 6456-62, 2007). The electrochemical stability of the electrode materials is very important in LECs. As a result, no LEC (or OLED) has been demonstrated that solely comprises solution-processable components, i.e. the cathode, active material, and anode, based on metal-free, lightweight and carbon-based materials.

There is hence a need for such a light-emitting device which can be easily produced and which does not have the drawbacks of the prior art devices.

SUMMARY

It is an object of the present disclosure to provide an improved or alternative light-emitting device that eliminates or alleviates at least some of the disadvantages of the prior art devices.

More specific objects include providing a light-emitting device which is easy to manufacture, low cost, lightweight, and which can be efficiently recycled.

The invention is defined by the appended independent claims. Embodiments are set forth in the appended dependent claims, and in the following description and drawings.

According to a first aspect, there is provided a light-emitting device comprising an anode and a cathode, and a light-emitting material contacting and separating the cathode and anode. The cathode comprises conducting graphene and/or graphene oxide.

By "conducting graphene and/or graphene oxide" is meant a graphene and/or graphene oxide film having properties which allow the material to be electronically conducting.

By "light-emitting material" is meant a material which is capable of emitting light when subjected to a difference in potential.

For the purpose of the present disclosure, "graphene" is defined as a substantially planar sheet of bonded (in a hexagonal pattern) carbon atoms, wherein the sheet is in a substantially 2-dimensional planar configuration. Hence, structures, such as 1-dimensional carbon nanotubes are not to be understood as comprised in the term "graphene" for the purpose of the present disclosure.

It is thus understood that the electrode may comprise a plurality of graphene and/or graphene oxide sheets, which may be stacked in a non-crystalline pattern. The graphene and/or graphene oxide sheets may wholly or partially overlap each other.

By using graphene, it is possible to attain a transparent cathode that can be solution processed, e.g. formed by printing or coating techniques. In this context, we define transparent to mean at least partially transparent. In other words, the graphene (or any other material) electrodes are visible, yet allow a significant portion of the light generated in a device to be transmitted to the device's environment.

It is noted that ITO is not a practical cathode material in an organic light-emitting device. It becomes reduced when biased negative in an LEC and in the process ITO turns brown, and reduces or loses its conductive abilities. In OLEDs, ITO is not used as the cathode material because of its high work function that prohibits effective electron injection.

In one embodiment, the anode may comprise a solution-processable conducting material. For example, the anode may be made from a transparent or partially transparent conducting polymer (TCP), which may be selected from a group consisting of polythiophenes, polypyrroles, polyanilines, olyisothianaphthalenes, polyfluorenes, polyphenylene vinylenes and copolymers thereof. Specific, non-limiting examples include Poly(3,4-ethylenedioxythiophene) poly(styrenesulfonate) (PEDOT-PSS), PEDOT tosylate and/or other transparent or partially transparent conducting polymers, and/or blends thereof. The anode need not be transparent at all, since the cathode is transparent.

As an alternative, the anode may also comprise a conducting graphene and/or graphene oxide.

By using a TCP or graphene as an anode it is possible to completely replace the transparent ITO anode with an anode that can be processed from solution, is light weight, carbon-based, and free from metals.

In one embodiment, the light-emitting material comprises an electrolyte.

Hence, there is provided a light-emitting electrochemical cell (LEC), which is a practical device in which such a combination of cathode and anode materials can be employed. LECs allows for a device function that is essentially independent of work function of electrodes and, in some cases, on the thickness of the light-emitting material.

In one embodiment, an easily printable, cheap, light-weight, benign, and robust device can be an LEC comprising solution-processable TCP or graphene as the anode, solution-processable graphene as the cathode, and a solution-processable light-emitting material.

Moreover, using TCP or graphene (or ITO) for the anode and graphene for the cathode allows for a light-emitting device structure, in which both electrodes are transparent.

The light-emitting material may comprise a single-component ionic light-emitting material, such as $Ru(bpy)_3^{2+}(X^-)_2$ (where bpy is 2,2'-bipyridine and $X^-$ typically is a molecular anions such as $ClO_4^-$ or $PF_6^-$) or an ionic conjugated polymer (a conjugated polyelectrolyte), such as cationic polyfluorene, or alternatively a mixture of such an ionic light-emitting and semiconducting material with an electrolyte.

According to one embodiment, the light-emitting and semiconducting material may comprise a neutral light-emitting molecule, such as rubrene.

In another embodiment, the light emitting material may comprise a light-emitting polymer.

By "light-emitting polymer" is understood a polymer which may emit light during operation of the light emitting device. The light-emitting polymer may be a conjugated polymer.

The light-emitting polymer may be selected from a group consisting of poly(para-phenylene vinylene (PPV), polyfluorenylene (PF), poly(1,4-phenylene) (PP), polythiophene (PT), and neutral and ionic derivatives thereof, and any type of co-polymer structure thereof.

In one embodiment, the light-emitting polymer may be a phenyl-substituted PPV copolymer, such as superyellow.

In another embodiment, the light-emitting polymer comprises poly[2-methoxy-5-(2-ethyl-hexyloxy)-1,4-phenylenevinylene] (MEH-PPV).

The electrolyte in the light-emitting material may comprises mobile ions, which allow efficient charge injection into the device.

The mobile ions may additionally also allow for electrochemical doping of the light-emitting material, allowing for devices with very thick light-emitting materials (wide interelectrode gaps).

By thick light-emitting materials is meant light-emitting materials that have a thickness above 300 nm, above 400 nm or above 500 nm.

The electrolyte may comprise a gel electrolyte.

In the alternative, or as a complement, the electrolyte may comprise a substantially solid electrolyte.

The electrolyte may comprise a substantially liquid electrolyte.

The electrolyte may comprise a salt. The salt may comprise at least one metal salt, said salt comprising a cation, such as Li, Na, K, Rb, Mg, or Ag, and a molecular anion, such as $CF_3SO_3$, $ClO_4$, or $(CF_sSO_2)_2N$.

The electrolyte in the light-emitting material may comprise an ion-dissolving material.

The ion-dissolving material may comprise at least one polymer material.

The ion-dissolving polymer material may be selected from a group consisting of poly(ethylene oxide), poly(propylene oxide), methoxyethoxy-ethoxy substituted polyphosphazane, and polyether based polyurethane, or combinations thereof.

The ion-dissolving material may comprise at least one non-polymer ion-dissolving material, such as a crown ether.

The electrolyte may comprise at least one ionic liquid.

In one particular embodiment, the electrolyte may comprise $KCF_3SO_3$ dissolved in poly(ethylene oxide).

The light-emitting material may comprise a surfactant, or a polymeric non-ion-dissolving material, such as polystyrene.

The electrodes may be arranged to at least partially sandwich the light-emitting material. In such an embodiment, the device may further comprise a spacer, arranged to maintain a predetermined distance between the electrodes.

The device may be formed on a substrate.

The substrate may be effectively non-flexible. For example, the substrate may comprise a glass or a glass-like material.

In the alternative, the substrate may be effectively flexible. For example, the substrate may comprise a polymeric material.

Examples of such polymeric materials include at least one of poly(ethylene terephthalate), poly(ethylene naphthalate), poly(imide), poly(carbonate), or combinations or derivatives thereof.

In the alternative, the substrate may comprise paper or paper-like material.

Either the anode or the cathode, or both, may be directly or indirectly deposited on the substrate.

In one embodiment, the anode may be arranged closer to the substrate than the cathode. In another embodiment, the cathode may be arranged closer to the substrate than the anode.

The electrodes may be substantially free from metal.

According to another embodiment of the first aspect, the light-emitting material may be effectively free from mobile ions.

By this type of device there is hence provided a light-emitting diode with a graphene cathode.

The light-emitting material may here comprise a multilayer structure wherein a layer next to the cathode is doped to provide a high electronic conductivity.

This layer next to the cathode may comprise a doped small molecule compound, such as Cs-doped 4,7-diphenyl-1,10-phenanthroline.

According to a second aspect there is provided use of conducting graphene and/or graphene oxide as a cathode in a light-emitting electrochemical cell and/or in a light-emitting diode.

According to a third aspect, there is provided a light-emitting device comprising an anode and a cathode, and a light-emitting material contacting and separating the cathode and anode. The cathode comprises a film of graphite or carbon black.

Graphite is understood as a material which is composed of a plurality of graphene sheets, which are stacked in a crystalline pattern.

The film of graphite or carbon black may be sufficiently thin to allow light emitted from the device to pass through it.

According to a fourth aspect, there is provided a system for generating light, comprising: a light-emitting device as described, and a power source, connected to the anode and cathode.

According to a fifth aspect, there is provided use of a device or system as described above for generating light.

According to a sixth aspect, there is provided a method for producing a light-emitting device comprising an anode and a cathode, and a light-emitting material contacting and separating the cathode and anode. The method comprises forming the cathode at least partially from conducting graphene and/or graphene oxide.

The cathode may be formed through deposition of a plurality of monolayers of graphene and/or graphene oxide.

BRIEF DESCRIPTION OF THE DRAWINGS

Embodiments of the present solution will now be described, by way of example, with reference to the accompanying schematic drawings and figures of experimental data.

DESCRIPTION OF EMBODIMENTS

In the following description, the term "graphene" will be used to collectively refer to conducting graphene and/or graphene oxide.

U.S. Pat. No. 5,682,043; U.S. Pat. No. 5,677,546; US20080084158A1; Shao, Y., G. C. Bazan, and A. J. Heeger: Longlifetime polymer light-emitting electrochemical cells. Advanced Materials, 2007, 19(3): p. 365-+; and Cao, Y., et al.: Efficient, fast response light-emitting electrochemical cells: Electroluminescent and solid electrolyte polymers with interpenetrating network morphology, Applied Physics Letters, 1996. 68(23): p. 3218-3220; Junfeng Fang, Piotr Matyba and Ludvig Edman: The Design and Realization of Flexible, Long-Lived Light-Emitting Electrochemical Cells. Advanced Functional Materials, 2009, 19 are referred to as providing general background information on the production of LECs.

Figure 1A:
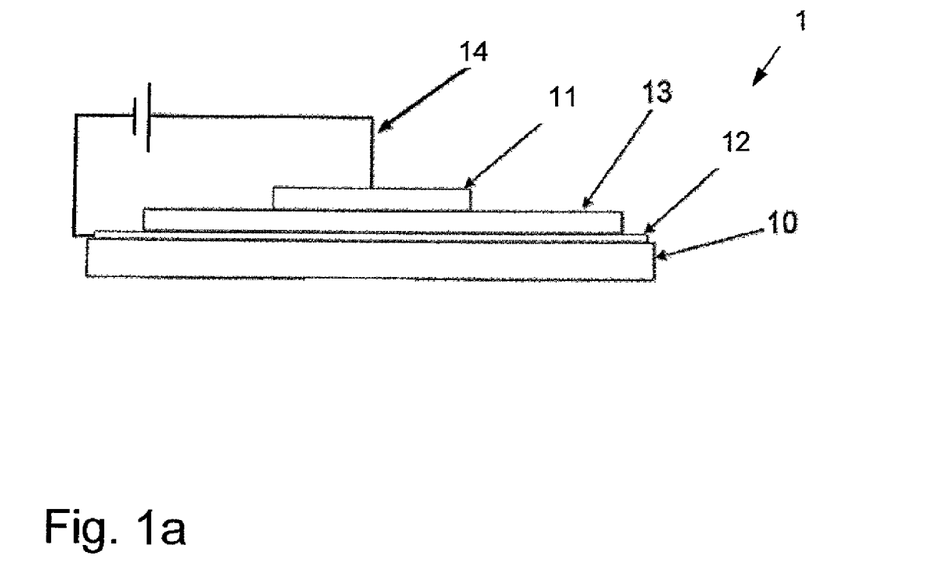
FIG. 1a is a schematic side view of a vertical sandwich device configuration.
Figure 1B:
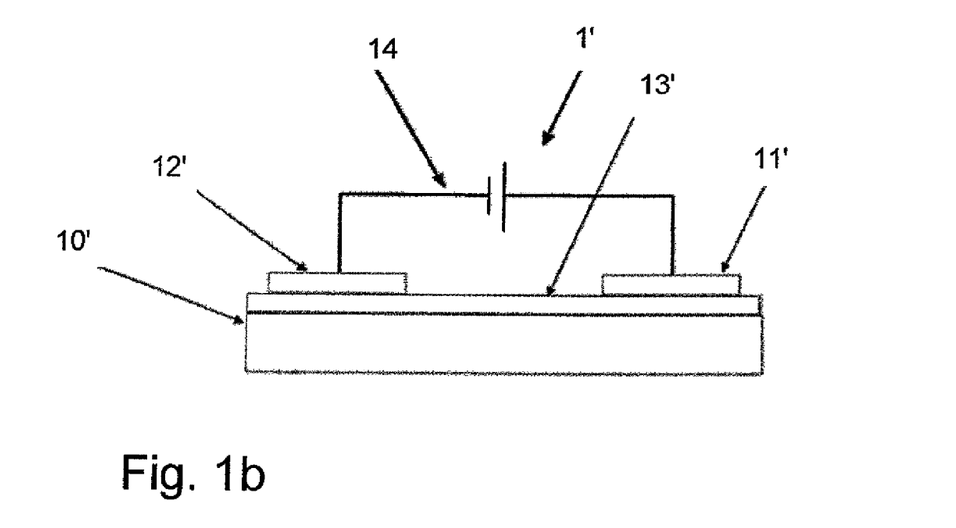
FIG. 1b is a schematic side view of a planar surface cell device configuration.

FIGS. 1a-1b illustrate different embodiments of a light-emitting device 1, 1'.

In FIG. 1a the device comprises a light-emitting material 13, sandwiched between a cathode 12 and an anode 11. In the figure the cathode is placed on top of the substrate 10 and the anode on top of the light-emitting material 13.

In FIG. 1b the light-emitting material 13' is placed on top of the substrate 10' and the cathode 12' and anode 11' are arranged on top of the material 13', but they may alternatively be placed beneath the material.

Figure 6:
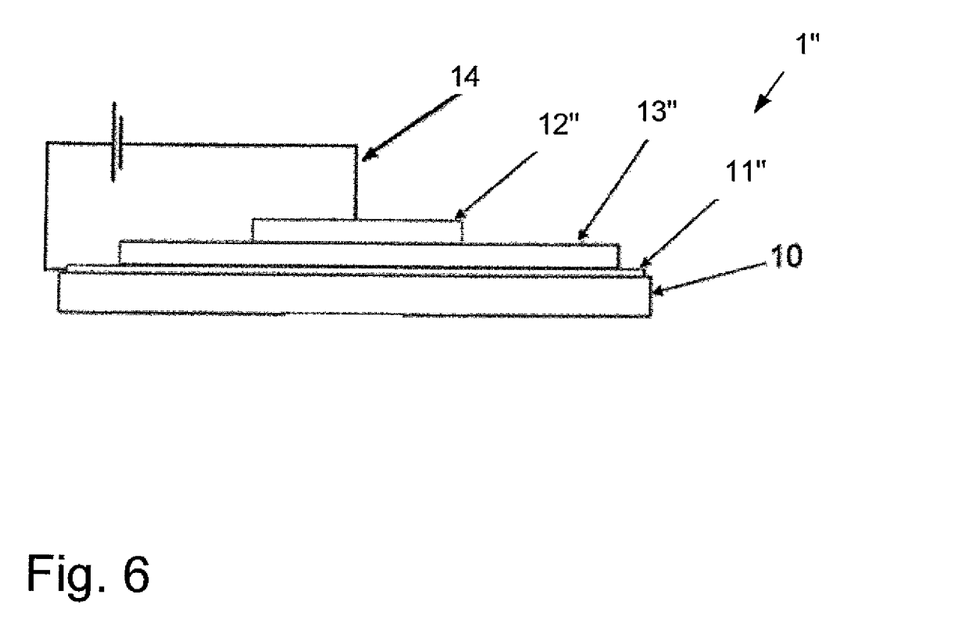
FIG. 6 illustrates an alternative device, wherein the cathode is arranged further away from the substrate than the anode.

FIG. 6 illustrates an alternative device 1", wherein the electrodes sandwich the light-emitting material 13" and wherein the cathode 12" is arranged further away from the substrate than the anode 11".

In one embodiment both the cathode 12, 12', 12" and the anode 11, 11', 11" comprise graphene and/or graphene oxide, which allows for a transparent light-emitting device.

According to an alternative embodiment the anode 11 and 11' and 11" may comprise transparent or partially transparent conducting polymer (TCP), such as PEDOT-PSS, or alternatively a non-transparent conducting polymer.

A power source 14 may be connected to the device 1, 1', 1".

US20090017211A1 is referred to as providing a general background on how to provide graphene and/or graphene oxide layers.

In the following, the structure, operation and experimental results of a device in the form of a light-emitting electrochemical cell (LEC) in a sandwich-cell configuration, such as the device schematically shown by way of example in FIG. 1a, will be described in more detail.

In this embodiment, the entire device structure comprises solely solution-processed carbon-based materials. The bottom cathode comprises graphene deposited from solution onto a substrate, the intermediate active layer comprises a light-emitting organic compound with intermixed mobile ions deposited from solution, and the top anode, comprises a screen-printed or doctor-blade coated conducting polymer.

The graphene electrodes were obtained from the group of Manish Chhowalla at Rutgers University. Graphite powders (Brandwell Graphite Inc.) were exfoliated via Hummer's method (Hirata, M.; Gotou, T.; Horiuchi, S.; Fujiwara, M.; Ohba, M. Thin-film particles of graphite oxide 1: High-yield synthesis and flexibility of the particles. Carbon 2004, 42, 2929-2937.). Unexfoliated graphite was removed by mild centrifugation. The graphene oxide suspension (in water) was then diluted and vacuum filtered onto cellulose filters (Eda, G.; Fanchini, G.; Chhowalla, M. Large-area ultrathin films of reduced graphene oxide as a transparent and flexible electronic material. Nature Nanotech. 2008, 3, 270-274.). The graphene oxide films were deposited onto a rigid (quartz) substrates and reduced in a Ar/$H_2$ environment (Ar: 90%, $H_2$: 10%) by annealing at 1000° C. for 15 min. The films were pre-annealed at 200° C. in vacuum for overnight to minimize the possible loss of carbon atoms upon annealing. Other techniques for creating graphene films allow for the use of a flexible plastic (PET) substrate, or for the film to be transferred from a rigid substrate to one that is flexible (see for example G. Eda, G. Fanchini, M. Chhowalla, Nat. Nanotechnol. 2008, 3, 270. Or X. Liang, Z. Fu, S. Y. Chou, Nano Lett. 2007, 7, 3840.) Various techniques (e.g. film transfer using a layer of poly(methyl methacrylate) can be used to transfer the film from quartz to another, e.g. flexible PET, substrate (Reina, A.; Son, H.; Jiao, L.; Fan, B.; Dresselhaus, M. S.; Liu, Z.; Kong, J. Transferring and Identification of Single- and Few-Layer Graphene on Arbitrary Substrates. J. Phys. Chem. C 2008, 112, 17741-17744).

The light-emitting material consists of a blend of the light-emitting semiconducting polymer "superyellow" (Merck), polyethylene oxide (PEO, $M_w$=5×10$^6$ g/mol, Aldrich), and $KCF_3SO_3$ (Alfa Aesar). The three components were separately dissolved in cyclohexanone in a concentration of 5 mg/ml. The three master solutions were mixed together in a volume ratio of (superyellow:PEO:$KCF_3SO_3$)=(1.0:1.35:0.25). The blend solution was drop cast onto the graphene electrode, and dried under nitrogen atmosphere at T=360 K for 12 h. The resulting light-emitting material layer was uniform to the eye over the entire substrate surface and estimated to be 1-2 um thick.

The top electrode comprises a defined pattern of the conducting polymer PEDOT-PSS (Clevios S V3, HC Stark). It was deposited from solution in a process similar to screen-printing under nitrogen atmosphere, as detailed below. A shadow mask was created by establishing a desired pattern in a thin cellophane shadow mask. The shadow mask was put in intimate contact with the light emitting material and attached to the edges of the substrate. The entire shadow mask-substrate assembly was heated at T=360 K for ≥10 min, before the viscous PEDOT-PSS solution was deposited onto the shadow mask in a "doctor blade" process. Immediately after the deposition of the PEDOT-PSS material, the sample was put on a hotplate a T=390 K for ≥12 h to remove remaining traces of solvents. The thickness of the PEDOT-PSS top electrode thickness is estimated to be 5-10 μm.

The devices were not encapsulated and therefore tested in a glove box under nitrogen atmosphere.

Figure 2A:
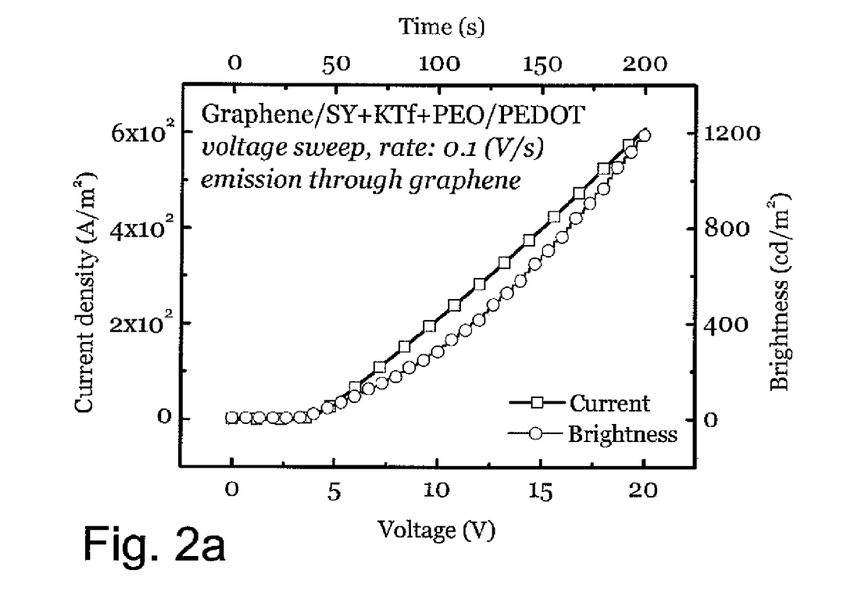
FIGS. 2a and 2b display the current and brightness as a function of voltage for a graphene/{superyellow+PEO+$KCF_3SO_3$}/PEDOT-PSS sandwich cell, with the graphene electrode biased as the negative cathode. The scan rate was 0.1 V/s, and the brightness was measured from the graphene side in 2a and from the PEDOT-PSS side in 2b.
Figure 2B:
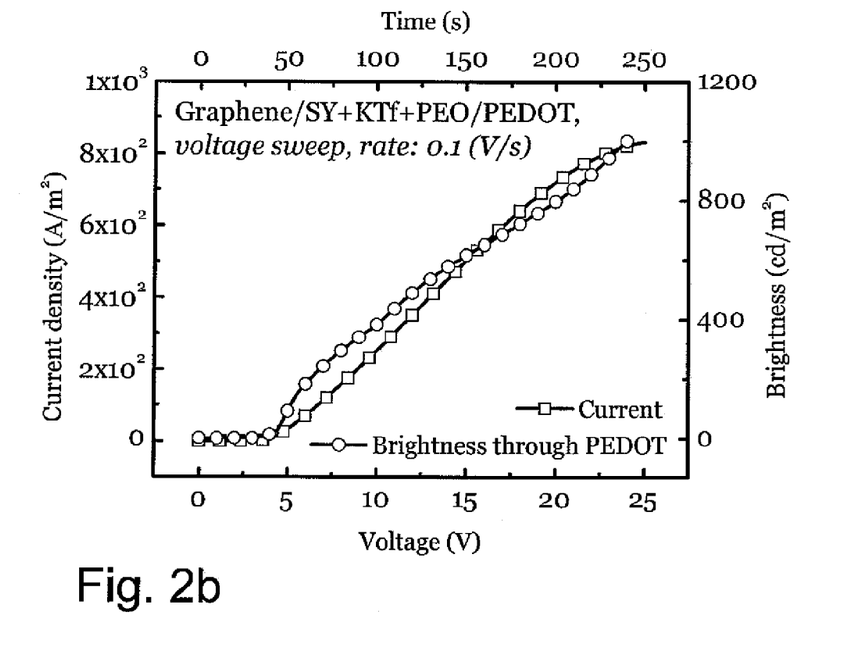
Figure 2C:
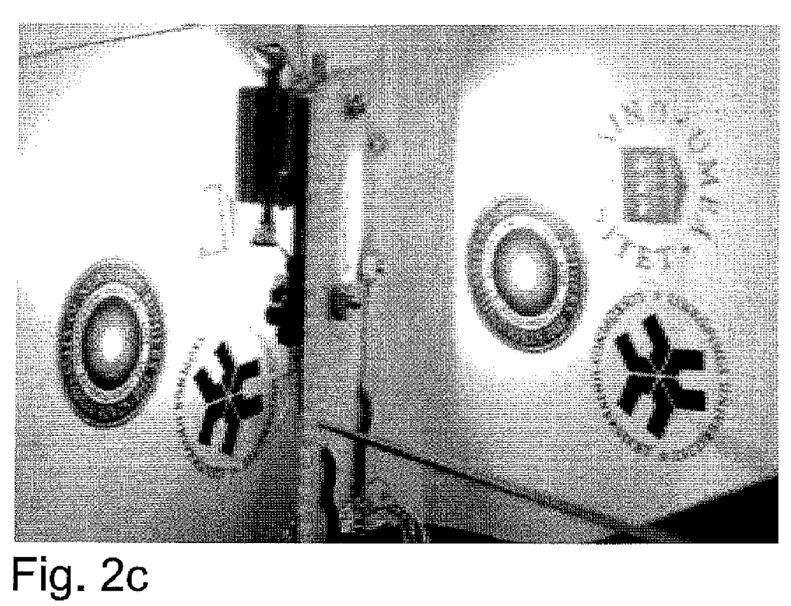
FIG. 2c presents a side-view photograph of graphene/{superyellow+PEO+$KCF_3SO_3$}/PEDOT-PSS sandwich cell during operation with the negative graphene cathode to the left.

FIGS. 2a and 2b show the current (open squares) and brightness (open circles) as a function of voltage for the graphene/light emitting material/PEDOT-PSS sandwich cell, with the graphene electrode biased as the negative cathode. The voltage was swept a rate of 0.1 V/s. In FIG. 2a the brightness is detected from the negative graphene cathode side, and in FIG. 2b the brightness is detected from the positive PEDOT-PSS anode side. The similarity between the observed brightness in FIGS. 2a and 2b illustrates that the device emits light with similar intensity in both directions and that both electrodes are transparent. This is further visualized in FIG. 2c, which presents a side view photograph of such a sandwich cell device during operation, illuminating paper placed on either side of the device.

Figure 3:
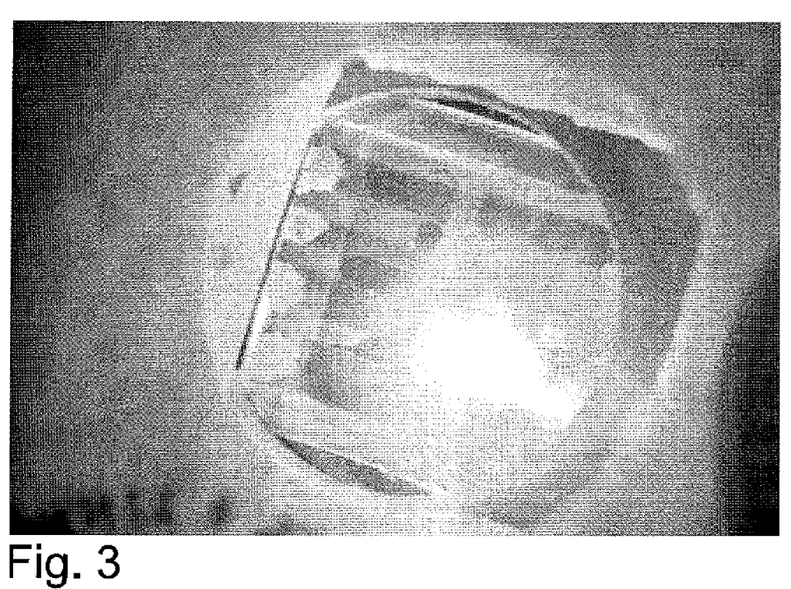
FIG. 3 is a photograph of the light emission from a graphene/{superyellow+PEO+$KCF_3SO_3$}/PEDOT:PSS device, as detected from the negative-biased graphene cathode side.

FIG. 3 is a photograph of the light emission from the LEC device at V≈20 V, as detected from the graphene cathode side.

Figure 4:
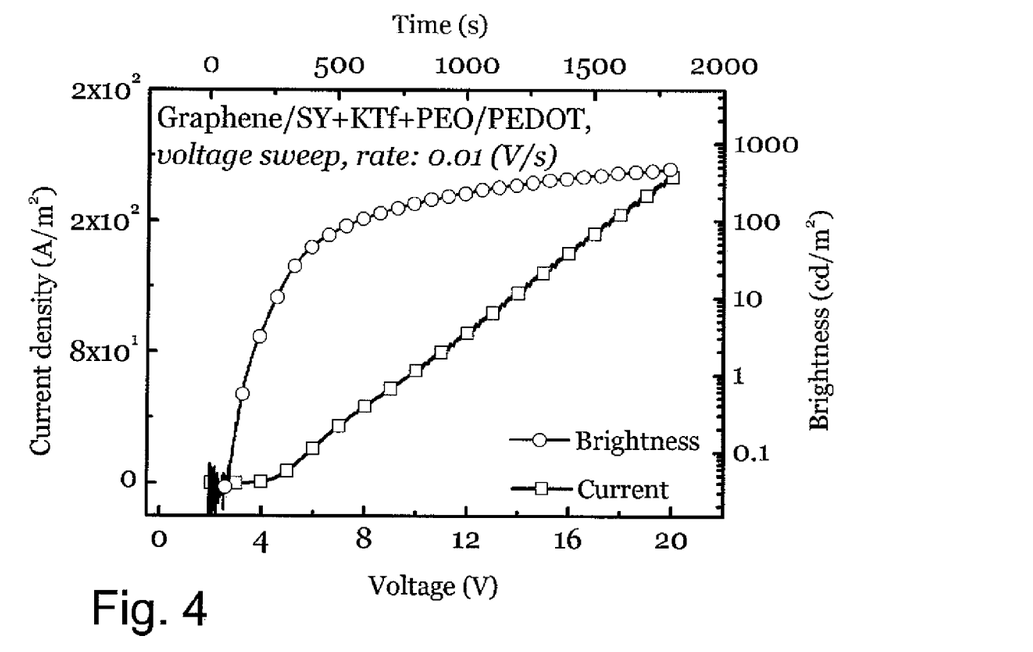
FIG. 4 displays the current and brightness (measured from the graphene cathode side) as a function of voltage for a graphene/{superyellow+PEO+$KCF_3SO_3$}/PEDOT:PSS device, recorded at a scan rate of 0.01 V/s, with the graphene electrode biased as the negative cathode.

FIG. 4 displays the current and brightness as a function of voltage for a pristine LEC device, recorded at a lower scan rate of 0.01 V/s, with the graphene electrode biased as the negative cathode. The device exhibits a very good performance. The onset of light emission is detected at a very low voltage, V=2.8 V, which is notably close to the minimum value dictated by the energy gap of "superyellow" ($E_g$≈2.5 eV), and the quantum efficiency and the power conversion efficiency (at V=4 V) are 4.6 cd/A and 2.3 lm/W, respectively.

Figure 5:
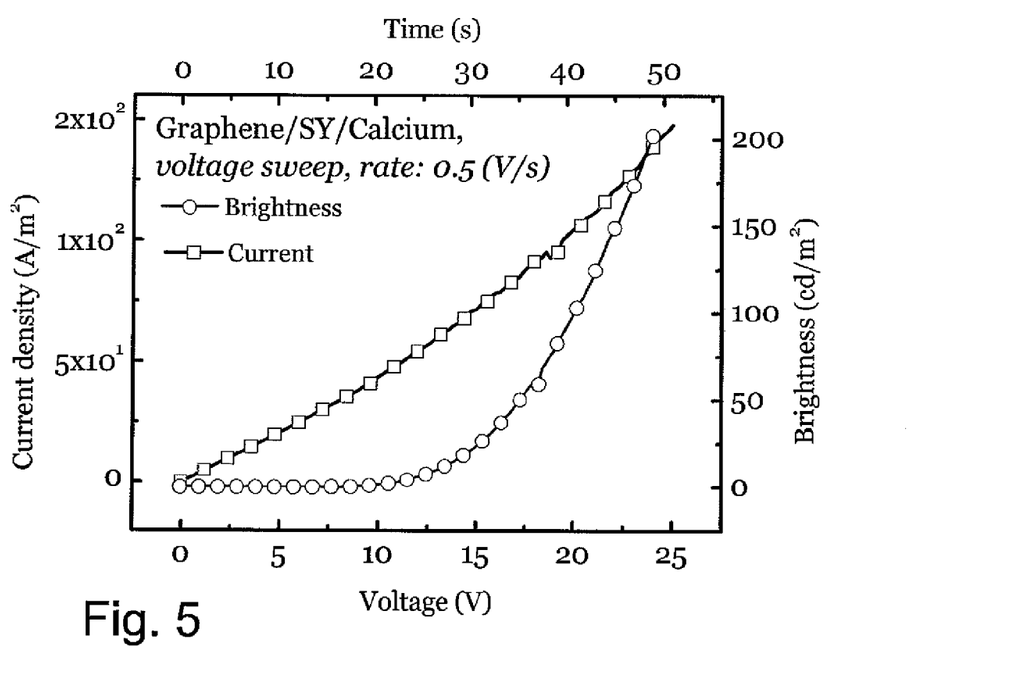
FIG. 5 presents the current and brightness (measured from the graphene anode side) as a function of voltage for a graphene/superyellow/Ca p-OLED device, with the graphene electrode biased as the positive anode.

FIG. 5 shows data from an experiment carried out on an p-OLED sandwich cell device with a graphene/superyellow/Ca structure. Note that the bottom graphene electrode is biased positive and accordingly functions as the anode in this device structure. It is notable that the device suffers from a significant leakage current, as exemplified by the high current at low voltage. The origin of this leakage current is most likely the uneven graphene surface, which in turn results in the formation of micro shorts between the anode and cathode. It seems highly plausible that this problem can be effectively resolved via the attainment of a smoother graphene surface or the addition of a planarizing PEDOT layer between the graphene anode and the active layer, and that the outcome will be a significantly improved device efficiency. It is further notable, that this problem is effectively eliminated in the LEC devices as a much thicker light emitting material could be employed (~1-2 um in FIGS. 2-4 vs. ~100 nm in the p-OLED device in FIG. 5). Nevertheless, the onset of light emission in the graphene-based p-OLED is low (V~7 V), the device emits significant light (>200 cd/m² at V=23 V), and the quantum efficiency is reasonably high (1.5 cd/A at V=23 V).

According to one embodiment the light-emitting material may comprise a single-component ionic light-emitting and semiconducting material, such as $Ru(bpy)_3^{2+}(X^-)_2$ (where bpy is 2,2'-bipyridine and X" typically is a molecular anions such as $ClO_4^-$ or $PF_6^-$) or an ionic conjugated polymer (a conjugated polyelectrolyte), such as cationic polyfluorene, or alternatively a mixture of such an ionic light-emitting and semiconducting material with an electrolyte.

The use of ruthenium and its radiance properties as a single-component ionic light-emitting and semiconducting material are disclosed by Slinker Jason D., et al (Nature Materials. Vol. 6, November 2007, 894-899 and Journal of Applied Physics, Vol. 95, No 8, 15 Apr. 2004).

Furthermore the use of iridum-based devices are shown by Lowry Michael S, et al (Chem. Mater, 2005, 17, 2712-5719) and Slinker, Jason D., et al (J. Am. Chem. Soc., 2004, 126, 2763-2767).

According to yet an alternative embodiment the light-emitting and semiconducting material may comprise a neutral light-emitting molecule, such as rubrene, and an electrolyte. Alternatively, the light-emitting and semiconducting material may comprise a neutral conjugated polymer, such as superyellow or MEH-PPV, and an electrolyte.

It is further possible to provide a light-emitting device wherein the light-emitting material is effectively free from mobile ions, i.e. an OLED. In such an OLED, the light-emitting material may comprise a multi-layer structure wherein a layer next to the cathode is doped to provide a high electronic conductivity. This layer next to the cathode may comprise a doped small molecule compound, such as Cs-doped 4,7-diphenyl-1,10-phenanthroline.

As a currently non-claimed alternative to an LEC, the device may be a light-emitting diode, wherein the light emitting material comprises an emissive layer, and wherein the anode presents a different work function as compared with the cathode. For example, the cathode may comprise a metal, and the anode may comprise conducting graphene. In this type of device the light emitting material may be effectively free from mobile ions.

According to this alternative the metal in the cathode may be calcium, as used to measure the data presented in FIG. 5.

The invention claimed is:

1. A light-emitting device comprising an anode and a cathode, and a light-emitting material contacting and separating the cathode and anode, wherein the cathode comprises conducting graphene and/or graphene oxide.

2. The light-emitting device as claimed in claim 1, wherein the anode comprises a solution-processable conducting material.

3. The light-emitting device as claimed in claim 1, wherein the anode comprises conducting graphene and/or graphene oxide.

4. The light emitting device as claimed in claim 1, wherein the light-emitting material comprises an electrolyte.

5. The light-emitting device as claimed in claim 4, wherein the light-emitting material comprises a single-component ionic light-emitting and semiconducting material.

6. The light-emitting device as claimed in claim 4, wherein the light-emitting material comprises a neutral light-emitting molecule.

7. The light-emitting device as claimed in claim 4, wherein the light-emitting material comprises a light-emitting polymer.

8. The light-emitting device as claimed in claim 7, wherein said light-emitting polymer is selected from a group consisting of poly(para-phenylene vinylene) (PPV), polyfluorenylene (PF), poly(1,4-phenylene) (PP), polythiophene (PT), and neutral and ionic derivatives thereof, including any type of co-polymer structure.

9. The light-emitting device as claimed in claim 4, wherein the electrolyte comprises mobile ions, which allow efficient charge injection into the device and/or electrochemical doping of the light-emitting material.

10. The light-emitting device as claimed in claim 4, wherein said electrolyte comprises at least one ionic liquid.

11. The light-emitting device as claimed in claim 4, wherein said electrolyte comprises $KCF_3SO_3$ dissolved in poly(ethylene oxide).

12. The light-emitting device as claimed in any claim 1, wherein said light-emitting material comprises a surfactant, or a polymeric non-ion-dissolving material.

13. The light-emitting device as claimed in claim 1, wherein the anode and the cathode are arranged to at least partially sandwich the light-emitting material.

14. The light-emitting device as claimed in claim 1, wherein at least one of the anode and the cathode is substantially free from metal.

15. The light-emitting device as claimed in claim 1, wherein the light-emitting material is effectively free from mobile ions.

16. The light-emitting device as claimed in claim 15, wherein the light-emitting material comprises a multi-layer structure wherein a layer next to the cathode is doped to provide a high electronic conductivity.

17. A system for generating light, comprising:
a light-emitting device comprising an anode and a cathode, and a light-emitting material contacting and separating the cathode and anode,
a power source, connected to the anode and cathode,
wherein the cathode comprises a material selected from the group consisting of conducting graphene and conducting graphene oxide.

18. A light-emitting electrochemical cell device comprising an anode and a cathode, and a light-emitting material comprising an electrolyte, contacting and separating the cathode and anode, wherein the cathode comprises a film of graphene and/or graphene oxide, and the cathode is substantially free from metal.

19. The system of claim 17, wherein the light-emitting device comprises a light-emitting electrochemical cell device wherein the light-emitting material comprises an electrolyte, and wherein the cathode, anode, and light-emitting material are metal-free.

* * * * *

UNITED STATES PATENT AND TRADEMARK OFFICE
CERTIFICATE OF CORRECTION

Page 1 of 1

PATENT NO. : 9,159,943 B2
APPLICATION NO. : 13/504400
DATED : October 13, 2015
INVENTOR(S) : Nathaniel D. Robinson et al.

It is certified that error appears in the above-identified patent and that said Letters Patent is hereby corrected as shown below:

Title Page, Item 30: "0950800" should be -- 0950800-3 --.

Signed and Sealed this
Eighth Day of December, 2015

Michelle K. Lee
*Director of the United States Patent and Trademark Office*